United States Patent
In et al.

(10) Patent No.: US 9,478,532 B2
(45) Date of Patent: Oct. 25, 2016

(54) ELECTRO STATIC DISCHARGE PROTECTION CIRCUIT AND ELECTRONIC DEVICE HAVING THE SAME

(71) Applicant: SAMSUNG DISPLAY CO., LTD., Yongin, Gyeonggi-Do (KR)

(72) Inventors: Hai-Jung In, Seoul (KR); Bo-Yong Chung, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/326,336

(22) Filed: Jul. 8, 2014

(65) Prior Publication Data
US 2015/0021595 A1    Jan. 22, 2015

(30) Foreign Application Priority Data
Jul. 17, 2013    (KR) .................. 10-2013-0084151

(51) Int. Cl.
*H01L 27/02*    (2006.01)
*H01L 27/12*    (2006.01)

(52) U.S. Cl.
CPC ....... *H01L 27/0266* (2013.01); *H01L 27/1225* (2013.01)

(58) Field of Classification Search
CPC .................. H01L 27/0266; H01L 27/0251
See application file for complete search history.

(56) References Cited

U.S. PATENT DOCUMENTS

| 4,989,057 A * | 1/1991 | Lu ............... H01L 29/7841 257/350 |
| 6,999,290 B1 * | 2/2006 | Takikawa et al. ........... 361/56 |
| 2004/0222813 A1 * | 11/2004 | Kim et al. .................. 324/770 |
| 2005/0062104 A1 | 3/2005 | Kim et al. |
| 2006/0285067 A1 * | 12/2006 | Kim .......................... 349/187 |
| 2007/0091525 A1 * | 4/2007 | Graebel et al. ............. 361/56 |
| 2010/0244029 A1 * | 9/2010 | Yamazaki et al. ........... 257/52 |
| 2013/0050173 A1 | 2/2013 | Koo |
| 2013/0207113 A1 * | 8/2013 | Tsai ................ H01L 27/1225 257/59 |
| 2013/0334529 A1 * | 12/2013 | Kaneko et al. .............. 257/43 |

FOREIGN PATENT DOCUMENTS

| KR | 10-0312621 B1 | 12/2001 |
| KR | 10-2005-0029564 A | 3/2005 |
| KR | 10-2013-0024032 A | 3/2013 |

* cited by examiner

*Primary Examiner* — Tucker J Wright
(74) *Attorney, Agent, or Firm* — Lewis Roca Rothgerber Christie LLP (57) ABSTRACT

An electro static discharge (ESD) protection circuit including a signal transmission line coupled to an external input terminal, the ESD protection circuit including: a first power line coupled to a high voltage power supply; a second power line coupled to a low voltage power supply; a plurality of first oxide thin film transistors coupled in parallel between the first power line and the signal transmission line, the first oxide thin film transistors being diode-connected; and a plurality of second oxide thin film transistors coupled in parallel between the signal transmission line and the second power line, the second oxide thin film transistors being diode-connected.

11 Claims, 6 Drawing Sheets

ELECTRO STATIC DISCHARGE PROTECTION CIRCUIT AND ELECTRONIC DEVICE HAVING THE SAME

CROSS REFERENCE TO RELATED APPLICATION

This application claims priority to and the benefit of Korean Patent Application No. 10-2013-0084151, filed on Jul. 17, 2013, the disclosure of which is hereby incorporated by reference herein in its entirety.

BACKGROUND

1. Field

Example embodiments of the inventive concept relate to electro static discharge (ESD) protection circuits and electronic devices having the same.

2. Description of the Related Art

When an external pulse voltage (e.g., pulse potential) due to electro static discharge is applied to an electronic device (e.g., a display device) through an external input terminal, the display-quality may be degraded or deteriorated due to noise and malfunction of internal circuits. Moreover, when a very high potential due to electro static discharge is applied to the display device, functional elements in the internal circuits may be damaged. Such voltage due to electro static discharge may be applied through not only the external input terminal, but also a direct input line or a wiring that is coupled to pixels.

An electronic device may include an electro static discharge (ESD) protection circuit that protects at least one internal circuit of the electronic device from the external pulse voltage due to the electro static discharges. However, if ESD protection circuits are implemented using a plurality of oxide thin film transistors, the manufacturing process may be complicated due to the complexity of the circuit structure. As a result, manufacturing costs of ESD protection circuits may also increase.

SUMMARY

Aspects of example embodiments are directed toward an electro static discharge (ESD) protection circuit having a simple circuit structure in which a plurality of oxide thin film transistors having stable characteristics are coupled in parallel.

Aspects of example embodiments are directed toward a display device including the ESD protection circuit.

Aspects of example embodiments are directed toward an ESD protection circuit that prevents an external pulse voltage due to electrostatic discharges from being input into an internal circuit including a signal transmission line coupled to an external input terminal.

According to example embodiments, an ESD protection circuit including a signal transmission line coupled to an external input terminal includes: a first power line coupled to a high voltage power supply, a second power line coupled to a low voltage power supply, a plurality of first oxide thin film transistors coupled in parallel between the first power line and the signal transmission line, the first oxide thin film transistors being diode-connected, and a plurality of second oxide thin film transistors coupled in parallel between the signal transmission line and the second power line, the second oxide thin film transistors being diode-connected.

The first oxide thin film transistor and the second oxide thin film transistor may be N-channel oxide thin film transistors and may include a gate electrode, a first electrode, and a second electrode and may have a positive threshold voltage.

The second electrode of each of the first oxide thin film transistors may be coupled to the first power line, the first electrode of each of the first oxide thin film transistors may be coupled to the signal transmission line, and the gate electrode of each of the first oxide thin film transistors may be coupled to the first electrode of a corresponding one of the first oxide thin film transistors; and a ratio of a channel length to a channel width of each of the first oxide thin film transistors may be less than or equal to 1.

The second electrode of each of the second oxide thin film transistors may be coupled to the signal transmission line, the first electrode of each of the second oxide thin film transistors may be coupled to the second power line, and the gate electrode of each of the second oxide thin film transistors may be coupled to the first electrode of a corresponding one of the second oxide thin film transistors; and a ratio of a channel length to a channel width of each of the second oxide thin film transistors may be less than or equal to 1.

The first oxide thin film transistors may be included a first protection unit; and the first protection unit may turn on the first oxide thin film transistors such that a current flows from the signal transmission line to the first power line when a voltage that is higher than a value corresponding to the threshold voltage of each of the first oxide thin film transistors plus a voltage supplied by the high voltage power supply is applied to the signal transmission line.

The second oxide thin film transistors may be included a second protection unit, and the second protection unit may turn on the second oxide thin film transistors such that a current flows from the second power line to the signal transmission line when a voltage that is lower than a value corresponding to a voltage supplied by the low voltage power supply minus the threshold voltage of each of the second oxide thin film transistors is applied to the signal transmission line.

The first oxide thin film transistors and the second oxide thin film transistors may be P-channel oxide thin film transistors and may include a gate electrode, a first electrode, and a second electrode, the P-channel oxide thin film transistors having a negative threshold voltage.

The second electrode of each of the first oxide thin film transistors may be coupled to the first power line, the first electrode of each of the first oxide thin film transistors may be coupled to the signal transmission line, and the gate electrode of each of the first oxide thin film transistors may be coupled to the first electrode of a corresponding one of the first oxide thin film transistors, and a ratio of a channel length to a channel width of each of the first oxide thin film transistors may be less than or equal to 1.

The second electrode of each of the second oxide thin film transistors may be coupled to the signal transmission line, the first electrode of each of the second oxide thin film transistors may be coupled to the second power line, and the gate electrode of each of the second oxide thin film transistors may be coupled to the first electrode of a corresponding one of the second oxide thin film transistors, and a ratio of a channel length to a channel width of each of the second oxide thin film transistors may be less than or equal to 1.

The first oxide thin film transistors may be included a first protection unit, and the first protection unit may be configured to turn on the first oxide thin film transistors such that a current flows from the signal transmission line to the first power line when a voltage that is higher than a value corresponding to the threshold voltage of each of the first oxide thin film transistors plus a voltage supplied by the high voltage power supply is applied to the signal transmission line.

The second oxide thin film transistors may be included a second protection unit, and the second protection unit may be configured to turn on the second oxide thin film transistors such that a current flows from the second power line to the signal transmission line when a voltage that is lower than a value corresponding to a voltage supplied by the low voltage power supply minus the threshold voltage of each of the second oxide thin film transistors is applied to the signal transmission line.

According to example embodiments, an electronic device including an internal circuit, a signal transmission line configured to transmit signals from external input terminals to the internal circuit, and an ESD protection circuit, wherein the ESD protection circuit includes: a first power line coupled to a high voltage power supply, a second power line coupled to a low voltage power supply, a plurality of a first oxide thin film transistors coupled in parallel between the first power line and the signal transmission line, and a plurality of a second oxide thin film transistors coupled in parallel between the signal transmission line and the second power line. In addition, the each of the first oxide thin film transistors and the second oxide thin film transistors includes a gate electrode, a first electrode, and a second electrode. The first oxide thin film transistors are diode-connected such that the second electrode of each of the first oxide thin film transistors is coupled to the first power line, the first electrode of each of the first oxide thin film transistors is coupled to the signal transmission line, and the gate electrode of each of the first oxide thin film transistors is coupled to the first electrode of a corresponding one of the first oxide thin film transistors. The second thin film transistors are diode-connected such that the second electrode of each of the second oxide thin film transistors is coupled to the signal transmission line, the first electrode of each of the second oxide thin film transistors is coupled to the second power line, and the gate electrode of each of the second oxide thin film transistors is coupled to the first electrode of a corresponding one of the second oxide thin film transistors. A ratio of a channel length to a channel width of each of the first oxide thin film transistors and the second oxide thin film transistors is less than or equal to 1.

The first oxide thin film transistors and the second oxide thin film transistors may be N-channel oxide thin film transistors having a positive threshold voltage.

The electronic device may include a display device including a display panel, a scan driving unit, a data driving unit, a timing control unit, and a power unit.

The signal transmission line may include at least one of a scan line, a data line, a transmission line coupled between the external input terminal and the scan driving unit, and a transmission line coupled between the external input terminal and the data driving unit.

Therefore, an ESD protection circuit according to example embodiments may reduce a size of the ESD protection circuit, may reduce manufacturing costs of the ESD protection circuit, and may simplify a manufacturing process of the ESD protection circuit. Here, the ESD protection circuit may efficiently protect a plurality of internal circuits of an electronic device from an external pulse voltage due to electro static discharges based on a simple circuit structure in which a plurality of oxide thin film transistors having stable characteristics are coupled in parallel.

In addition, an electronic device including the ESD protection circuit may achieve improved reliability without any external device for preventing electro static discharges, and may reduce manufacturing costs of the electronic device because the ESD protection circuit efficiently protects a plurality of internal circuits of the electronic device from an external pulse voltage due to the electro static discharges.

BRIEF DESCRIPTION OF THE DRAWINGS

Example embodiments can be understood in more detail from the following description taken in conjunction with the accompanying drawings, in which.

DETAILED DESCRIPTION

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another elements) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
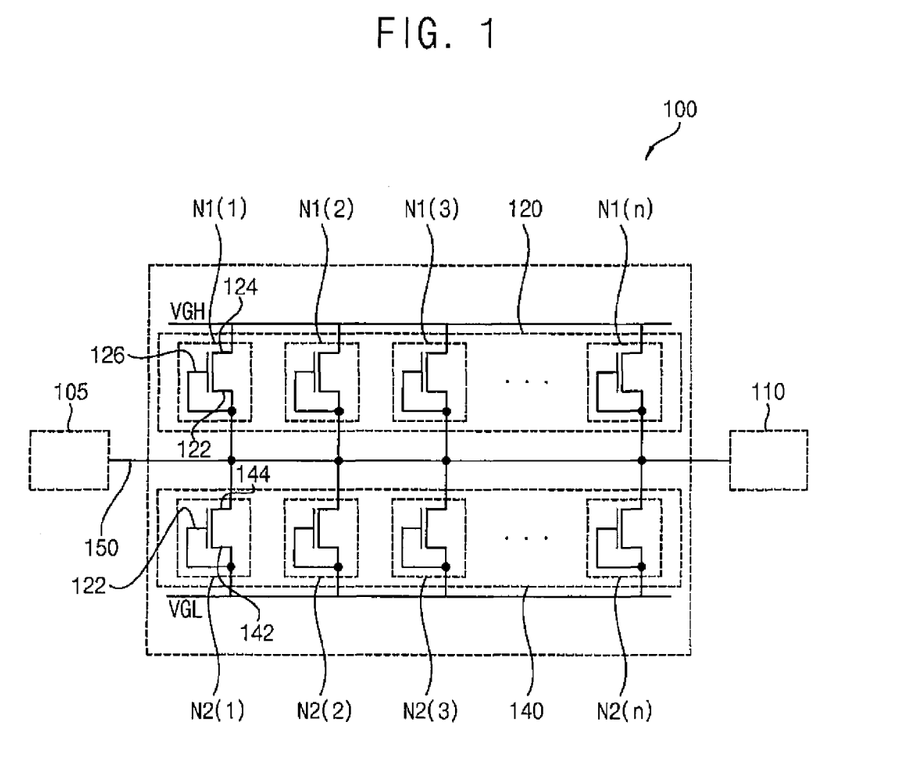
FIG. 1 is a diagram illustrating an electro static discharge (ESD) protection circuit according to example embodiments.

FIG. 1 is a diagram illustrating an ESD protection circuit according to example embodiments.

Referring to FIG. 1, the ESD protection circuit 100 may include a first power line VGH, a second power line VGL, a plurality of first oxide thin film transistors N1(1) through N1(n), where, n is an integer greater than or equal to 2, and a plurality of second oxide thin film transistors N2(1) through N2(n).

Specifically, the first power line VGH may be electrically coupled to a high voltage power supply, and the second power line VGL may be coupled to a low voltage power supply. A first protection unit 120 may include the first oxide thin film transistors N1(1) through N1(n) that are coupled in parallel between the first power line VGH and the signal transmission line 150, where the first oxide thin film transistors N1(1) through N1(n) are diode-connected. A second protection unit 140 may include the second oxide thin film transistors N2(1) through N2(n) that are coupled in parallel between the signal transmission line 150 and the second power line VGL, where the second oxide thin film transistors N2(1) through N2(n) are diode-connected.

Generally, a pulse voltage generated by external power supplies may be transmitted to an internal circuit 110 through the signal transmission line 150. The first protection unit 120 may include the first oxide thin film transistors N1(1) through N1(n). A tolerance range for normal operations of the internal circuit 110 (e.g., referred to as a normal voltage range) is between a maximum value and a minimum value of the pulse voltage. Thus, when a voltage that is higher than the maximum value of the pulse voltage is applied to an external input terminal 105 by electro static discharges, the first protection unit 120 may prevent (e.g., substantially prevent or reduce) sudden voltage fluctuation of the signal transmission line 150 to protect the internal circuit 110 from being damaged. The second protection unit 140 may include the second oxide thin film transistors N2(1) through N2(n). Thus, when a voltage that is lower than the minimum value of the pulse voltage is applied to an external input terminal 105 by electro static discharges, the second protection unit 140 may prevent (e.g., substantially prevent or reduce) sudden voltage fluctuation of the signal transmission line 150 to protect the internal circuit 110 from being damaged.

Each of the first oxide thin film transistors N1(1) through N1(n) may include a gate electrode 126, a first electrode 122, and a second electrode 124. Each of the second oxide thin film transistors N2(1) through N2(n) may include a gate electrode 146, a first electrode 142, and a second electrode 144. In example embodiments, the first oxide thin film transistors N1(1) through N1(n) and the second oxide thin film transistors N2(1) through N2(n) may be N-channel oxide thin film transistors, where the N-channel oxide thin film transistors each have a positive threshold voltage.

The first oxide thin film transistors N1(1) through N1(n) may be included within the first protection unit 120. In example embodiments, the first oxide thin film transistors N1(1) through N1(n) may be electrically coupled in parallel between the first power line VGH and the signal transmission line 150, where the first oxide thin film transistors N1(1) through N1(n) are diode-connected. For example, the first electrode 122 of each of the first oxide thin film transistors N1(1) through N1(n) may correspond to a drain electrode of each of the first oxide thin film transistors N1(1) through N1(n), and the second electrode 124 of each of the first oxide thin film transistors N1(1) through N1(n) may correspond to a source electrode of each of the first oxide thin film transistors N1(1) through N1(n).

In example embodiments, the second electrode 124 of each of the first oxide thin film transistors N1(1) through N1(n) may be coupled to the first power line VGH, the first electrode 122 of each of the first oxide thin film transistors N1(1) through N1(n) may be coupled to the signal transmission line 150, and the gate electrode 126 of each of the first oxide thin film transistors N1(1) through N1(n) may be coupled to the first electrode 122 of a corresponding one of the first oxide thin film transistors N1(1) through N1(n). That is, because the gate electrode 126 is electrically coupled to the first electrode 122, the first oxide thin film transistors N1(1) through N1(n) may function as diodes in the ESD protection circuit 100. For this reason, the first oxide thin film transistors N1(1) through N1(n) may be referred to as diode-connected oxide thin film transistors. For example, the first oxide thin film transistors N1(1) through N1(n) may be coupled between the signal transmission line 150 and the first power line VGH. Thus, when a voltage that is higher than the maximum value of the pulse voltage is applied to an external input terminal 105 by electro static discharges, the first oxide thin film transistors N1(1) through N1(n) may be turned on and may be electrically coupled between the first power line VGH and the signal transmission line 150.

In example embodiments, the second electrode 144 of each of the second oxide thin film transistors N2(1) through N2(n) may be coupled to the signal transmission line 150, the first electrode 142 of each of the second oxide thin film transistors N2(1) through N2(n) may be coupled to the second power line VGL, and the gate electrode 146 of each of the second oxide thin film transistors N2(1) through N2(n) may be coupled to the first electrode 142 of a corresponding one of the first oxide thin film transistors N2(1) through N2(n). That is, because the gate electrode 146 is electrically coupled to the first electrode 142, the second oxide thin film transistors N2(1) through N2(n) may function as diodes in the ESD protection circuit 100. For this reason, the second oxide thin film transistors N2(1) through N2(n) may be referred to as diode-connected oxide thin film transistors. Thus, when a voltage that is lower than the minimum value of the pulse voltage is applied to an external input terminal 105 by electro static discharges, the second oxide thin film transistors N2(1) through N2(n) may be turned on and may be electrically coupled between the second power line VGL and the signal transmission line 150.

In example embodiments, a ratio of a channel length (L) to a channel width (W) (i.e., W/L) of each of the first oxide thin film transistors N1(1) through N1(n) and the second oxide thin film transistors N2(1) through N2(n) may be less than or equal to 1. Generally, an N-channel oxide thin film transistor has negative threshold voltage. In this case, when a voltage within the normal voltage range is applied to the signal transmission line 150, the N-channel oxide thin film transistor may be turned on. As a result, an ESD protection circuit having the N-channel oxide thin film transistor may not normally operate although a voltage within the normal voltage range is applied to the signal transmission line 150. However, as the W/L of an N-channel oxide thin film transistor becomes smaller, a threshold voltage of the N-channel oxide thin film transistor may be moved in a positive direction. For example, when the W/L of the N-channel oxide thin film transistor is less than or equal to 1, the threshold voltage of the N-channel oxide thin film transistor may be adjusted to be greater than 0.6V. Therefore, the ESD protection circuit 100 may normally operate because the ESD protection circuit 100 includes a plurality of N-channel oxide thin film transistors having the W/L that is less than or equal to 1.

In example embodiments, the first oxide thin film transistors N1(1) through N1(n) may be coupled in parallel between the first power line VGH and the signal transmission line 150. When the W/L of each of the first oxide thin film transistors N1(1) through N1(n) is less than or equal to 1, the threshold voltage of each of the first oxide thin film transistors N1(1) through N1(n) may be moved in a positive direction. However, a current flowing through each of each of the first oxide thin film transistors N1(1) through N1(n) may be reduced by structural characteristics of each of the first oxide thin film transistors N1(1) through N1(n). Thus, if the ESD protection circuit 100 includes one first oxide thin film transistor N1(1), the ESD protection circuit 100 cannot efficiently prevent electro static discharges for the signal transmission line 150. Therefore, the ESD protection circuit 100 may include a plurality of first oxide thin film transistors N1(1) through N1(n). As a result, when a voltage outside the normal voltage range is applied from the external input terminal 105, the first oxide thin film transistors N1(1) through N1(n) coupled in parallel are turned on, such that a current may flow (e.g., sufficiently flow) from the signal transmission line 150 to the first power line VGH. As described above, the first oxide thin film transistors N1(1) through N1(n) have improved characteristic of positive threshold voltage, such that the ESD protection circuit 100 may operate properly.

In example embodiments, the second oxide thin film transistors N2(1) through N2(n) may be coupled in parallel between the signal transmission line 150 and the second power line VGL. Therefore, when a voltage outside the normal voltage range is applied from the external input terminal 105, the second oxide thin film transistors N1(1) through N1(n) coupled in parallel may be turned on, such that a current may flow (e.g., sufficiently flow) from the second power line VGL to the signal transmission line 150.

For normal operations of the internal circuit 110, the pulse voltage is required to be transmitted from the external input terminal 105 to the internal circuit 110 through the signal transmission line 150. A voltage VH applied to the first power line VGH may be greater than the maximum value of the pulse voltage. A voltage VL applied to the second power line VGL may be smaller than the minimum value of the pulse voltage.

In a normal state (e.g., a state in which the pulse voltage within the normal voltage range is applied to the signal transmission line 150), the first oxide thin film transistors N1(1) through N1(n) and the second oxide thin film transistors N2(1) through N2(n) may remain in a reverse-biased state. Thus, the first oxide thin film transistors N1(1) through N1(n) and the second oxide thin film transistors N2(1) through N2(n) may be turned off. That is, the first oxide thin film transistors N1(1) through N1(n) and the second oxide thin film transistors N2(1) through N2(n) may have very high impedance. Therefore, the signal transmission line 150 may be electrically decoupled (e.g., blocked) from the first power line VGH and the second power line VGL.

When a voltage that is higher than a value corresponding to the threshold voltage VT of each of the first oxide thin film transistors N1(1) through N1 (*n*) VT plus a voltage supplied by the high voltage power supply VGH (e.g., VT+VH) is suddenly applied to the signal transmission line 150, the first oxide thin film transistors N1(1) through N1(n) included in the first protection unit 120 may be turned on. Therefore, a current may flow from the signal transmission line 150 to the first power line VGH. In this way, the first protection unit 120 prevents sudden voltage fluctuation, so that the internal circuit 110 may be protected from the electro static discharges. Here, the second oxide thin film transistors N2(1) through N2(n) included in the second protection unit 140 are turned off, so that the signal transmission line 150 is electrically decoupled from the second power line VGL.

When a voltage that is lower than a value corresponding to a voltage supplied by the low voltage power supply VGL (e.g., VL) minus the threshold voltage of each of the second oxide thin film transistors N2(1) through N2(n) (e.g., VL-VT) is suddenly applied to the signal transmission line 150, the second oxide thin film transistors N2(1) through N2(n) included in the second protection unit 140 may be turned on. Therefore, a current may flow from the second power line VGL to the signal transmission line 150. In this way, the second protection unit 140 prevents sudden voltage fluctuation, so that the internal circuit 110 may be protected from the electro static discharges. Here, the first oxide thin film transistors N1(1) through N1(n) included in the first protection unit 120 are turned off, so that the signal transmission line 150 is electrically decoupled from the second power line VGL.

As described above, the ESD protection circuit 100 may have the first oxide thin film transistors N1(1) through N1(n), and the second oxide thin film transistors N2(1) through N2(n). Because the ratio of the channel length to the channel width (i.e., W/L) of each of the first oxide thin film transistors N1(1) through N1(n) and the second oxide thin film transistors N2(1) through N2(n) is less than or equal to 1, the first oxide thin film transistors N1(1) through N1(n) and the second oxide thin film transistors N2(1) through N2(n) may have positive threshold voltage. The first oxide thin film transistors N1(1) through N1(n) coupled in parallel between the first power line VGH and the signal transmission line 150. The oxide thin film transistors N2(1) through N2(n) coupled in parallel between the second power line VGL and the signal transmission line 150. Thus, the ESD protection circuit 100 may reduce a size of the ESD protection circuit 100, may reduce manufacturing costs of the ESD protection circuit 100, and may simplify a manufacturing process of the ESD protection circuit 100. Here, the ESD protection circuit 100 may efficiently protect a plurality of internal circuits of an electronic device from an external pulse voltage due to electro static discharges based on a simple circuit structure in which a plurality of oxide thin film transistors N1(1) through N1(n) and N2(1) through N2(n) having stable characteristics are coupled in parallel.

Figure 2A:
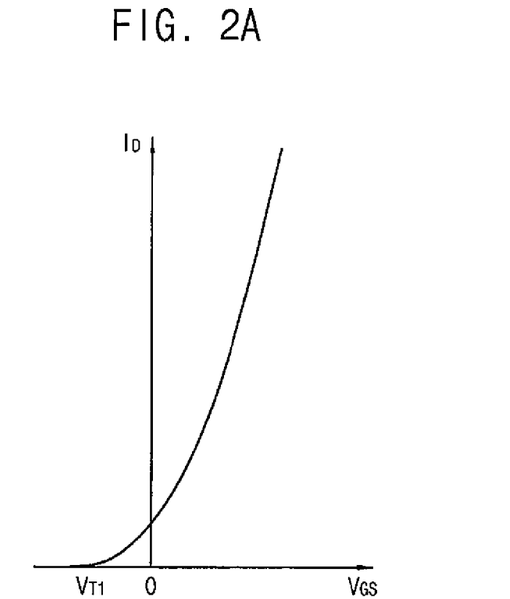
FIG. 2A is a graph illustrating current-voltage (I-V) characteristics of a comparable oxide thin film transistor.

FIG. 2A is a graph illustrating I-V characteristics of an oxide thin film transistor.

Specifically, the graph illustrates ID-VGS characteristic of the oxide thin film transistor. The oxide thin film transistor may include a gate electrode, a first electrode, and a second electrode. For example, the first electrode may correspond to a drain electrode, and the second electrode may correspond to a source electrode. That is, because the gate electrode is electrically coupled to the first electrode, the oxide thin film transistor may function as diodes in a circuit. For this reason, the oxide thin film transistor may be referred to as diode-connected oxide thin film transistor. As illustrated in FIG. 2A, the diode-connected oxide thin film transistor may have a negative threshold voltage. Generally, because an oxide semiconductor has high carrier concentration, the oxide thin film transistor corresponding to the oxide semiconductor may operate in a depletion mode. Thus, a very large current may flow even when a gate voltage of the oxide thin film transistor is 0V. For this reason, a large negative gate voltage is necessary to turn off the oxide thin film transistor. However, the threshold voltage of the oxide thin film transistor needs to be moved in a positive direction for a low power display device.

When a voltage within the normal voltage range is applied to a signal transmission line, the oxide thin film transistors of an ESD protection circuit may be turned off, so that the signal transmission line 150 is decoupled to the first power line VGH or the second power line VGL. However, if the oxide thin film transistor has negative threshold voltage, when a voltage within the normal voltage range is applied to the signal transmission line 150, the oxide thin film transistor may be turned on. As a result, the ESD protection circuit cannot normally operate. Therefore, it is necessary that the threshold voltage moves to positive direction.

Figure 2B:
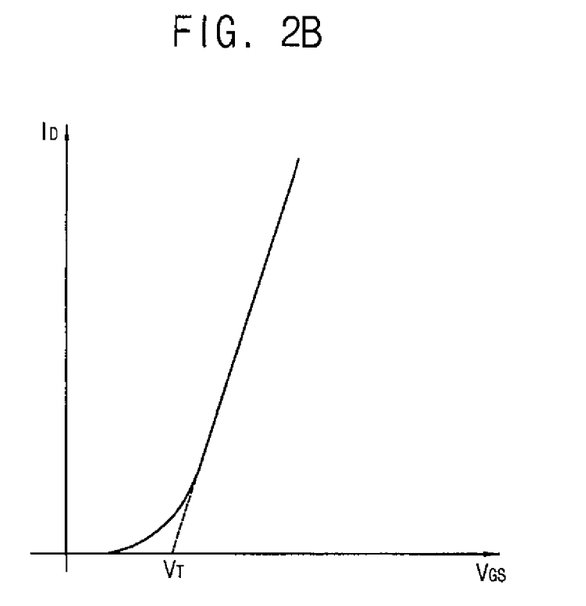
FIG. 2B is a graph illustrating I-V characteristics of an oxide thin film transistor included in the ESD protection circuit of FIG. 1.

FIG. 2B is a graph illustrating I-V characteristics of an oxide thin film transistor included in the ESD protection circuit of FIG. 1.

Specifically, the graph illustrates ID-VGS characteristic of the N-channel oxide thin film transistor included in the ESD protection circuit of FIG. 1. As illustrated in FIG. 2B, a threshold voltage of the oxide thin film transistor may be changed (e.g., increased) by adjusting a ratio of a channel length L to a channel width W (i.e., W/L) of the oxide thin film transistor.

$$I_D = \frac{1}{2}\mu_0 c_0 \frac{W}{L}(V_{GS} - V_T)^2 \qquad \text{Equation 1}$$

(Where, μ0 is electron mobility, C0 is conductance, W is a channel length, L is a channel width, and μ0 and C0 are constant.)

Equation 1 shows a relationship among the drain current ID, the gate-source voltage VGS, and the threshold voltage VT in the N-channel oxide thin film transistor. Thus, the graph of FIG. 2B may illustrate a quadratic curve related to the drain current and the gate-source voltage in a linear region.

According to Equation 1, when the threshold voltage VT has a positive value and gets increased, the W/L needs to be reduced in order to maintain the drain current ID. Thus, the oxide thin film transistor may have a positive threshold voltage by reducing the channel width W or lengthening the channel length L.

For example, when the W/L of the oxide thin film transistor is less than or equal to 1, the threshold voltage of the N-channel oxide thin film transistor may be adjusted to be greater than 0.6V. Therefore, the ESD protection circuit may normally operate because the ESD protection circuit includes a plurality of N-channel oxide thin film transistors having the W/L that is less than or equal to 1.

Figure 3A:
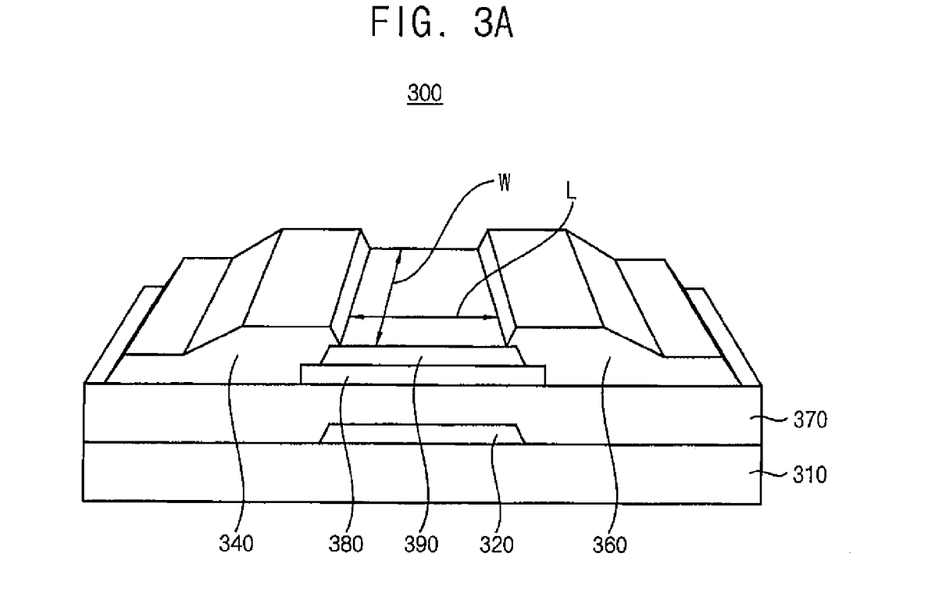
FIG. 3A is a perspective view of an example of an oxide thin film transistor included in the ESD protection circuit of FIG. 1.

FIG. 3A is a perspective view of an example of an oxide thin film transistor included in the ESD protection circuit of FIG. 1.

Referring to FIG. 3A, the oxide thin film transistor 300 may include an insulation substrate 310, a gate electrode 320, a gate insulation layer 370, an active layer 380, an etch stopper layer 390, a source electrode 340, and a drain electrode 360. According to one example embodiment, the oxide thin film transistor 300 may include a protection layer covering the etch stopper layer 390, the source electrode 340, and the drain electrode 360.

The insulation substrate 310 may include a silicon substrate, a plastic substrate, or a glass substrate. The insulation substrate 310 may be flexible.

The gate electrode 320 may be formed on the insulation substrate 310 by depositing a metal on the insulation substrate 310 and by patterning the metal.

The gate insulation layer 370 may be formed on the overall insulation substrate 310 on which the gate electrode 320 is formed. The gate insulation layer 370 may include inorganic materials (e.g., SiNx, SiO2, etc.), or high dielectric constant materials (e.g., hafnium oxide, aluminum oxide, etc.).

An oxide semiconductor layer may be formed on the overall insulation substrate 310 on which the gate insulation layer 370 is formed. The active layer 380 may be formed by selectively etching the oxide semiconductor layer in masking process. Here, the active layer 380 may include a-IGZO semiconductor that includes amorphous zinc-oxide (ZnO) and heavy metals (e.g., indium, gallium, etc.). However, materials constituting the active layer 380 are not limited thereto.

Generally, because an oxide semiconductor has high carrier concentration, the oxide thin film transistor 300 corresponding to the oxide semiconductor may operate in a depletion mode. Thus, a very large current may flow even when a gate voltage of the oxide thin film transistor 300 is 0V. However, the threshold voltage of the oxide thin film transistor needs to be moved in a positive direction for a low power display device.

The threshold voltage of the oxide thin film transistor 300 may be changed (e.g., increased) by adjusting a ratio of a channel length L to a channel width W (i.e., W/L) of the oxide thin film transistor 300. The channel width W may correspond to a length (e.g., height) of the source electrode 340 (or a length of the source electrode 360) in a direction perpendicular to the channel length L. The channel length L and the channel width W may be defined by controlling the pattern gap between the source electrode 340 and the drain electrode 360. The threshold voltage of the oxide thin film transistor may be adjusted by controlling a ratio of the channel length L to the channel width W (i.e., W/L). When the W/L of the oxide thin film transistor 300 is less than or equal to 1, the threshold voltage of the oxide thin film transistor 300 may be adjusted to be greater than 0.6V. As the W/L of an oxide thin film transistor 300 becomes smaller, a threshold voltage of the oxide thin film transistor 300 may be moved in a positive direction. Thus, an ESD protection circuit may normally operate because the ESD protection circuit includes a plurality of the oxide thin film transistors 300 each having the W/L that is less than or equal to 1.

The etch stopper layer 390 may be formed on the insulation substrate 310 on which the active layer 380 is formed. The etch stopper layer 390 may include inorganic insulation materials (e.g., SiNx, SiO2, etc.). The etch stopper layer 390 may be formed by selectively etching the inorganic insulation materials in masking process. The etch stopper layer 390 may enable avoiding changing the carrier concentration in a plasma treatment process. Accordingly, a forming process of the etch stopper layer 390 may be omitted.

The active layer 380 and the etch stopper layer 390 may be formed at one time by one masking process.

The source electrode 340 and the drain electrode 360 may be formed on the insulation substrate 310 on which the etch stopper layer 390 is formed. The source electrode 340 and the drain electrode 360 may be formed by pattering a metal having a space. The first electrode may correspond to the drain electrode 360, and the second electrode may correspond to the source electrode 340.

Figure 3B:
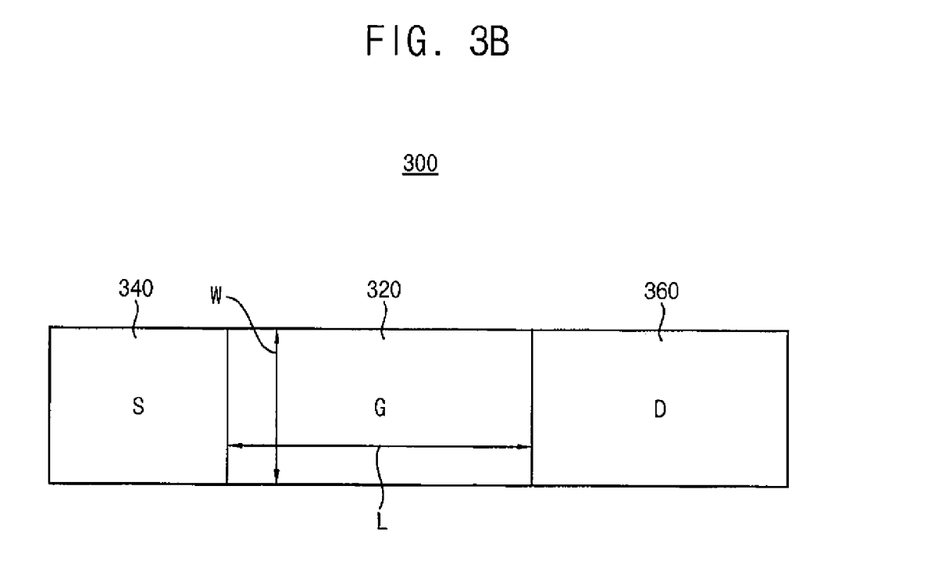
FIG. 3B is a plan view of an example of an oxide thin film transistor included in the ESD protection circuit of FIG. 1.

FIG. 3B is a plan view of an example of an oxide thin film transistor included in the ESD protection circuit of FIG. 1.

Referring to FIG. 3B, the oxide thin film transistor 300 may include a gate electrode 320, a source electrode 340, and a drain electrode 360.

The channel length L may correspond to a distance between the source electrode 340 and the drain electrode 360. The channel width W may correspond to a length (e.g., height) of the source electrode 340 (or a length of the source electrode 360) in a direction perpendicular to the channel length L. The channel length L and the channel width W may be defined by controlling the pattern gap between the source electrode 340 and the drain electrode 360. The threshold voltage of the oxide thin film transistor may be adjusted by controlling a ratio of the channel length L to the channel width W (i.e., W/L). Because these are described above, duplicate descriptions will not be repeated.

Figure 4:
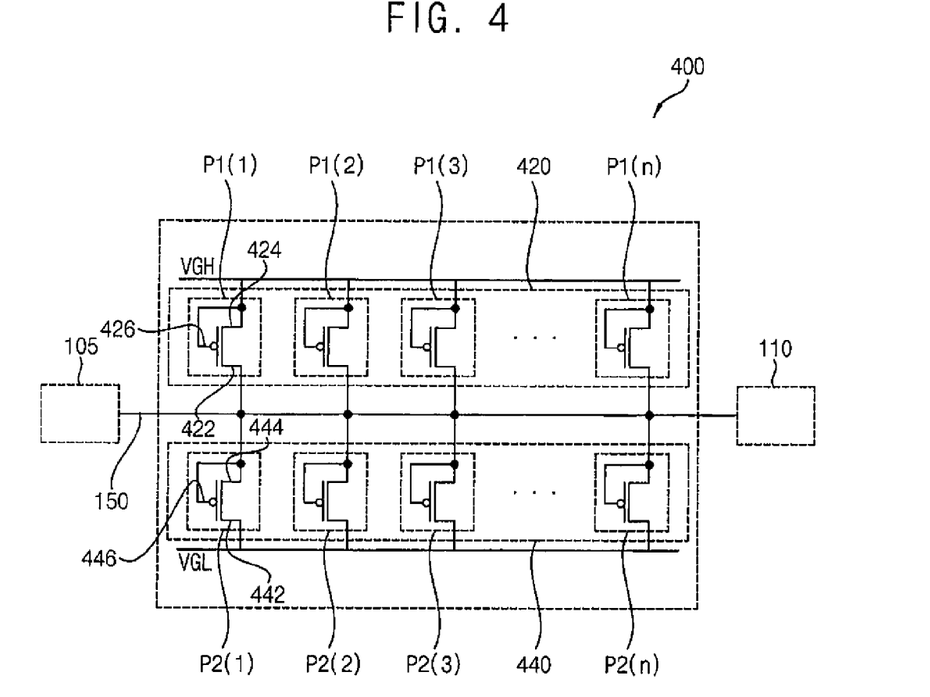
FIG. 4 is a diagram illustrating an ESD protection circuit according to example embodiments.

FIG. 4 is a diagram illustrating an ESD protection circuit according to example embodiments.

Referring to FIG. 4, the ESD protection circuit 400 may include a first power line VGH, a second power line VGL, a plurality of a first oxide thin film transistors P1(1) through P1($n$) ($n$ is an integer 2 or more), and a plurality of a second oxide thin film transistors P2(1) through P2($n$).

In example embodiments, the first oxide thin film transistors P1(1) through P1($n$) and the second oxide thin film transistors P2(1) through P2($n$) may be P-channel oxide thin film transistors, where the P-channel oxide thin film transistors each have a negative threshold voltage.

The first power line VGH may be electrically coupled to a high voltage power supply and the second power line VGL may be coupled to a low voltage power supply. A first protection unit 420 may include the plurality of first oxide thin film transistors P1(1) through P1($n$) that is coupled in parallel between the first power line VGH and the signal transmission line 150, where the first oxide thin film transistors P1(1) through P1($n$) are diode-connected. A second protection unit 440 may include the plurality of second oxide thin film transistors P2(1) through P2($n$) that is coupled in parallel between the signal transmission line 150 and the second power line VGL, where the second oxide thin film transistors P2(1) through P2($n$) are diode-connected.

The first oxide thin film transistors P1(1) through P1($n$) may be included within the first protection unit 420. In example embodiments, the first oxide thin film transistors P1(1) through P1($n$) may be electrically coupled in parallel between the first power line VGH and the signal transmission line 150, where the first oxide thin film transistors P1(1) through P1($n$) are diode-connected. For example, the first electrode 422 of each of the first oxide thin film transistors P1(1) through P1($n$) may correspond to a source electrode of each of the first oxide thin film transistors P1(1) through P1($n$), and the second electrode 424 of each of the first oxide thin film transistors P1(1) through P1($n$) may correspond to a drain electrode of each of the first oxide thin film transistors P1(1) through P1($n$). The second electrode 424 of each of the first oxide thin film transistors P1(1) through P1($n$) may be coupled to the first power line VGH, the first electrode 422 of each of the first oxide thin film transistors P1(1) through P1($n$) may be coupled to the signal transmission line 150, and the gate electrode 426 of each of the first oxide thin film transistors P1(1) through P1($n$) may be coupled to the first electrode 422 of a corresponding one of the first oxide thin film transistors P1(1) through P1($n$). In addition, a ratio of a channel length to a channel width (W) of each of the first oxide thin film transistors P1(1) through P1($n$) may be less than or equal to 1.

The second oxide thin film transistors P2(1) through P2($n$) may constitute or be included within the second protection unit 440. For example, the first electrode 442 of each of the second oxide thin film transistors P2(1) through P2($n$) may correspond to a source electrode of each of the second oxide thin film transistors P2(1) through P2($n$), and the second electrode 444 of each of the second oxide thin film transistors P2(1) through P2($n$) may correspond to a drain electrode of each of the second oxide thin film transistors P2(1) through P2($n$). In example embodiments, the second electrode 444 of each of the second oxide thin film transistors P2(1) through P2($n$) may be coupled to the signal transmission line 150, the first electrode 442 of each of the second oxide thin film transistors P2(1) through P2($n$) may be coupled to the second power line VGL, and the gate electrode 446 of each of the second oxide thin film transistors P2(1) through P2($n$) may be coupled to the first electrode 442 of a corresponding one of the second oxide thin film transistors P2(1) through P2($n$). In addition, a ratio of a channel length to a channel width of each of the second oxide thin film transistors P2(1) through P2(n) may be less than or equal to 1.

In example embodiments, when a voltage that is higher than a value corresponding to the threshold voltage of each of the first oxide thin film transistors P1(1) through P1(n) plus a voltage supplied by the high voltage power supply VGH is suddenly applied to the signal transmission line 150, the first oxide thin film transistors P1(1) through P1(n) included in the first protection unit 420 may be turned on. Therefore, a current may flow from the signal transmission line 150 to the first power line VGH.

In other example embodiments, when a voltage that is lower than a value corresponding to a voltage supplied by the low voltage power supply VGL (i.e., VL) minus the threshold voltage of each of the second oxide thin film transistors P2(1) through P2(n) is suddenly applied to the signal transmission line 150, the second oxide thin film transistors P2(1) through P2(n) included in the second protection unit 440 may be turned on. Therefore, a current may flow from the second power line VGL to the signal transmission line 150.

The ESD protection circuit 400 including P-channel oxide thin film transistors and the ESD protection circuit 100 including N-channel oxide thin film transistors may have coterminous structures that may operate to have the same function. Because these are described above, duplicate descriptions will not be repeated.

Figure 5:
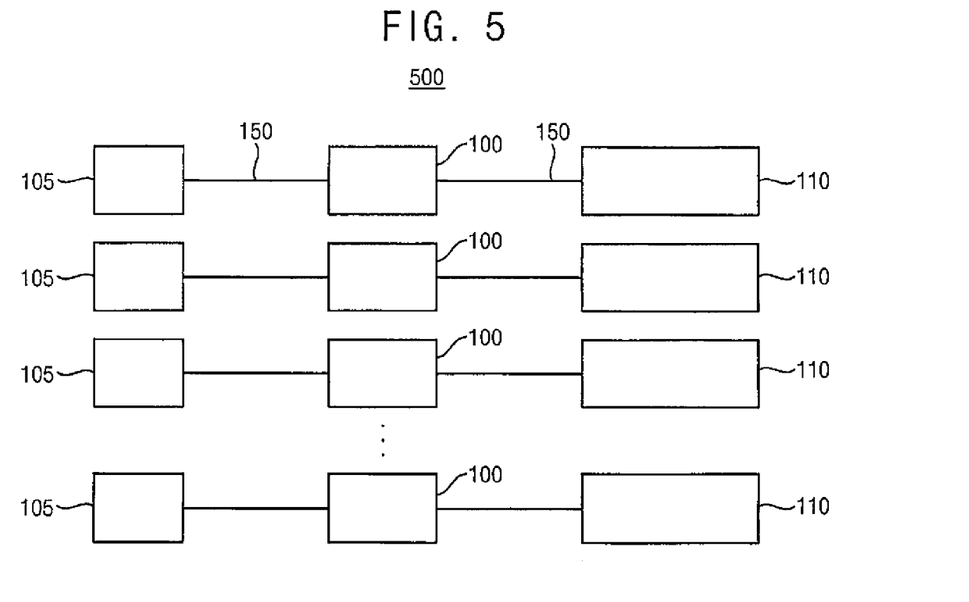
FIG. 5 is a block diagram illustrating an electronic device according to example embodiments.

FIG. 5 is a block diagram illustrating an electronic device according to example embodiments.

Referring to FIG. 5, the electronic device 500 may include at least one internal circuit 110, at least one signal transmission line 150 that transmits a signal from an external input terminal 105 to the internal circuit 110, and at least one ESD protection circuit 100 that prevents an external pulse voltage due to electro static discharges from being input into the internal circuit 110 through the signal transmission line 150.

The ESD protection circuit 100 may include a first power line coupled with a high voltage power supply, a second power line coupled with a low voltage power supply, a plurality of a first oxide thin film transistors coupled in parallel between the first power line and the signal transmission line 150, and a plurality of a second oxide thin film transistors coupled in parallel between the signal transmission line 150 and the second power line. The first oxide thin film transistors and the second oxide thin film transistors may include a gate electrode, a first electrode, and a second electrode. The first oxide thin film transistors may be diode-connected such that the second electrode of each of the first oxide thin film transistors is coupled to the first power line, the first electrode of the first each of the first oxide thin film transistors is coupled to the signal transmission line 150, and the gate electrode of each of the first oxide thin film transistors is coupled to the first electrode of a corresponding one of the first oxide thin film transistors. The second thin film transistors may be diode-connected such that the second electrode of each of the second oxide thin film transistors is coupled to the signal transmission line, the first electrode of each of the second oxide thin film transistors is coupled to the second power line, and the gate electrode of each of the second oxide thin film transistors is coupled to the first electrode of a corresponding one of the second oxide thin film transistors. In addition, a ratio of a channel length to a channel width of each of the first oxide thin film transistors and the second oxide thin film transistors may be less than or equal to 1. Because these are described above, duplicate descriptions will not be repeated. Additionally, the oxide thin film transistors being N-channel are not limited thereto. For example, the oxide thin film transistors may be P-channel (e.g., positive-channel) oxide thin film transistors.

The electronic device 500 may include a processor, a memory device, a storage device, an input/output (I/O) device, a power supply, and a display device. Here, the display device may correspond to the display device 600 of FIG. 6. In addition, the electronic device 500 may further include a plurality of ports for communicating a video card, a sound card, a memory card, a universal serial bus (USB) device, other electronic devices, etc.

The processor may perform various computing functions. The processor may be a microprocessor, a central processing unit (CPU), etc. The processor may be coupled to other components via an address bus, a control bus, a data bus, etc. Further, the processor may be coupled to an extended bus such as a peripheral component interconnection (PCI) bus. The memory device may store data for operations of the electronic device 500. The storage device may be a solid state drive (SSD) device, a hard disk drive (HDD) device, a CD-ROM device, etc. The I/O device may be an input device such as a keyboard, a keypad, a mouse, etc., and an output device such as a printer, a speaker, etc. The power supply may provide a power for operations of the electronic device 500. The display device may communicate with other components via the buses (or, external input terminals) or other communication links.

The processor, the memory device, the storage device, the input/output (I/O) device, the power supply, and the display device may include internal circuits to perform each function that is described above. The ESD protection circuit 100 may efficiently protect a plurality of internal circuits of an electronic device 500 from an external pulse voltage due to electro static discharges based on a simple circuit structure in which a plurality of oxide thin film transistors having stable characteristics are coupled in parallel. So that, the electronic device 500 operates normally.

Figure 6:
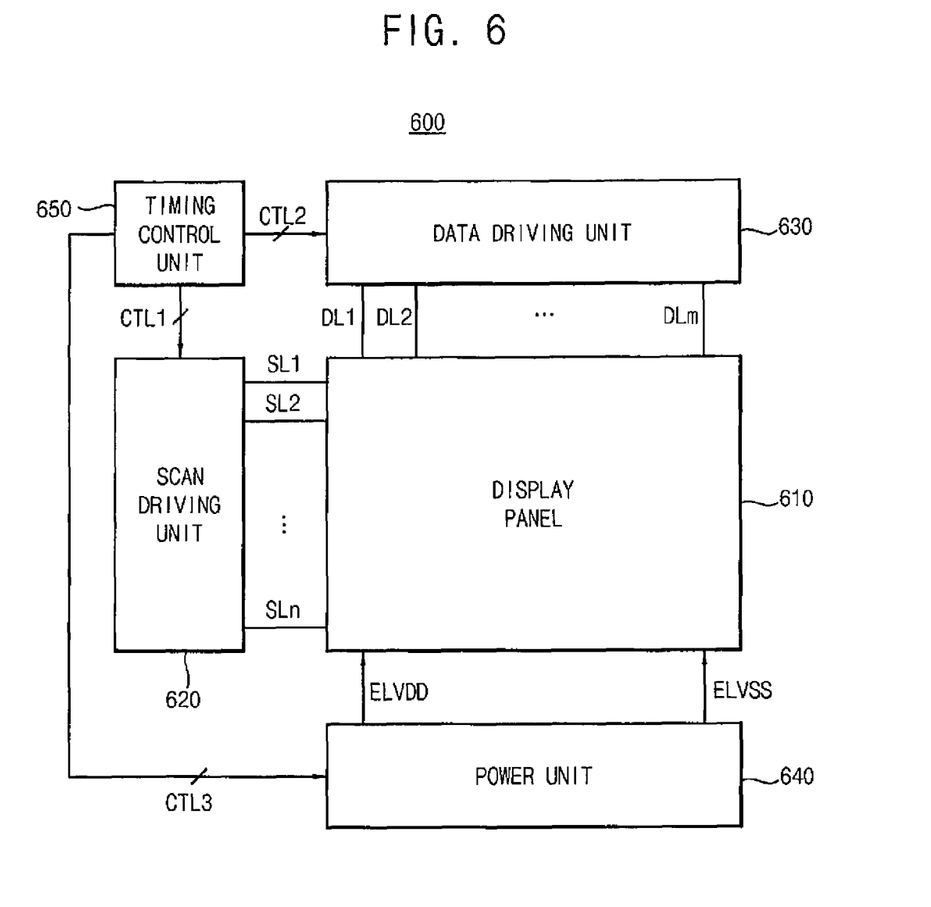
FIG. 6 is a block diagram illustrating an example of a display device included in the electronic device of FIG. 5.

FIG. 6 is a block diagram illustrating an example of a display device included in the electronic device of FIG. 5.

Referring to FIG. 6, in example embodiments, the display device 600 may include a display panel 610, a scan driving unit 620, a data driving unit 630, a power unit 640, and a timing control unit 650.

The display panel 610 may include a plurality of pixels including pixel circuits. The scan driving unit 620 may provide a scan signal to the pixel circuits through a plurality of scan-lines SL1 through SLn. The data driving unit 630 may provide a data signal to the pixel circuits through a plurality of data-lines DL1 through DLm. The power unit 640 may generate a high-power voltage ELVDD and a low-power voltage ELVSS, and may provide the high-power voltage ELVDD and the low-power voltage ELVSS to the pixel circuits through a plurality of power-lines. The timing control unit 650 may control the scan driving unit 620, the data driving unit 630, and the power unit 640. The timing control unit 650 may generate a plurality of control signals CTL1, CTL2, CTL3, and may provide the control signals CTL1, CTL2, CTL3 to the scan driving unit 620, the data driving unit 630, and the power unit 640, respectively. Although it is illustrated in FIG. 6 that the scan driving unit 620, the data driving unit 630, the power unit 640, and the timing control unit 650 are separately implemented, the scan driving unit 620, the data driving unit 630, the power unit 640, and the timing control unit 650 may be combined. Thus, the scan driving unit 620, the data driving unit 630, the power unit 640, and the timing control unit 650 may be interpreted as functions of at least one peripheral circuit coupled to the display panel 610. For example, the timing control unit 650 may perform operations of the scan driving unit 620, the data driving unit 630, the power unit 640, or may include at least one component for performing operations of the scan driving unit 620, the data driving unit 630, the power unit 640. An external input terminal (or, a pad unit) receives a signal from the power unit 640, external power supplies, etc., and transmit the signal to an internal circuit (e.g., pixel circuit) through a signal transmission line.

An ESD protection circuit may be coupled to at least one of the signal transmission lines. The ESD protection circuit may include a first power line coupled with a high voltage power supply, a second power line coupled with a low voltage power supply, a plurality of first oxide thin film transistors coupled in parallel between the first power line and the signal transmission line, and a plurality of second oxide thin film transistors coupled in parallel between the signal transmission line and the second power line. The first oxide thin film transistors and the second oxide thin film transistors may include a gate electrode, a first electrode, and a second electrode. The first oxide thin film transistors may be diode-connected such that the second electrode of each of the first oxide thin film transistors is coupled to the first power line, the first electrode of each of the first oxide thin film transistors is coupled to the signal transmission line, and the gate electrode of each of the first oxide thin film transistors is coupled to the first electrode of a corresponding one of the first oxide thin film transistors. The second thin film transistors may be diode-connected such that the second electrode of each of the second oxide thin film transistors is coupled to the signal transmission line, the first electrode of each of the second oxide thin film transistors is coupled to the second power line, and the gate electrode of each of the second oxide thin film transistors is coupled to the first electrode of a corresponding one of the second oxide thin film transistors. In addition, a ratio of a channel length to a channel width of each of the first oxide thin film transistors and the second oxide thin film transistors may be less than or equal to 1. In example embodiments, the first oxide thin film transistors and the second oxide thin film transistors are N-channel oxide thin film transistors having a positive threshold voltage. Because these are described above, duplicate descriptions will not be repeated.

In example embodiments, the signal transmission line may include at least one of a scan line SL1 through SLn, a data line DL1 through DLm, a transmission line coupled between the external input terminal and the scan driving unit 620, and a transmission line coupled between the external input terminal and the data driving unit 630. However, the signal transmission lines are not limited thereto. In some example embodiments, the signal transmission line may include a transmission line coupled to the power unit 640, transmission line coupled to the timing control unit 650, etc.

Therefore, the ESD protection circuit may efficiently prevent electro static charges by flowing into the internal circuit.

The display device 600 may include an organic light emitting display (OLED) device, a liquid crystal display (LCD) device, an electroluminescence (EL) device, a plasma display panel (PDP) device, an iridescent display (ID) device, a light emitting diode (LED) device, an electrophoretic display device, an incandescent display device, etc.

Figure 7:
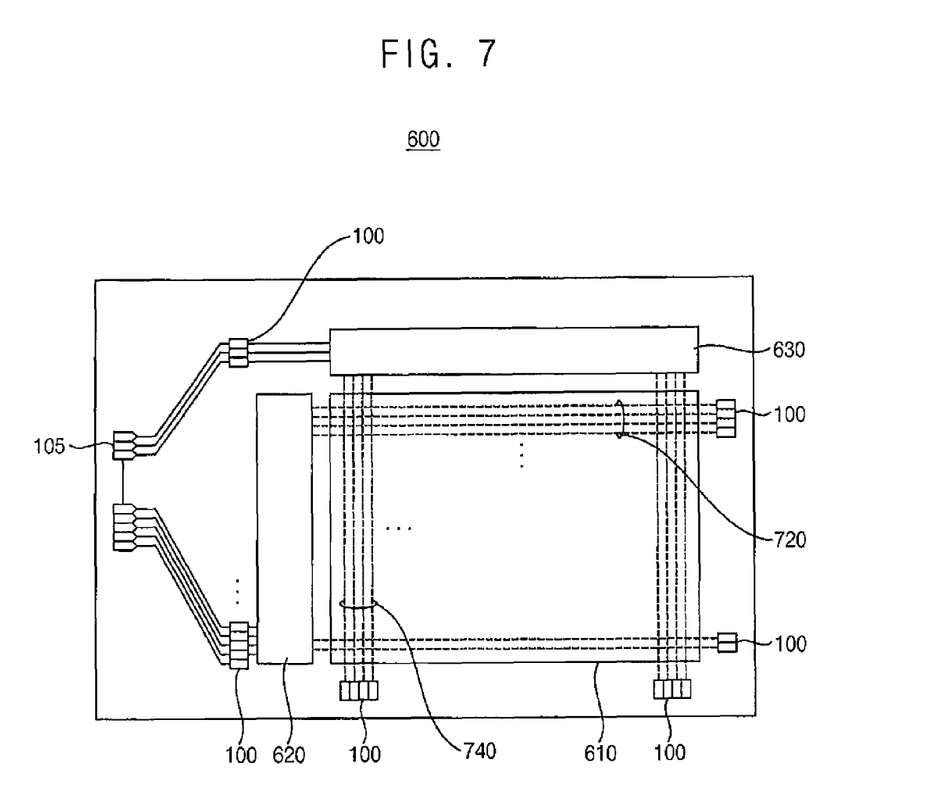
FIG. 7 is a diagram illustrating an example in which an ESD protection circuit is applied to the display device of FIG. 6.

FIG. 7 is a diagram illustrating an example in which an ESD protection circuit is applied to the display device of FIG. 6.

Referring to FIG. 7, the display device 600 may include a display panel 610 including a plurality of pixels, a scan driving unit 620, a data driving unit 630, and a plurality of ESD protection circuits 100. Particularly, the display device 600 may include a plurality of oxide thin film transistors.

A plurality of scan lines 620 coupled to the scan driving unit 620 may be arranged on the rows of display panel 610, and a plurality of data lines 740 coupled to the data driving unit 630 may be arranged on the columns of display panel 610, the scan lines 620 and the data lines crossing each other. Here, a plurality of pixels may be arranged at or in the crossed regions having matrix form.

The display device 610 may include a plurality of external input terminals 105 that receive signals from external devices. Each of the external input terminals may be coupled to the scan driving unit 620, the data driving unit 630, etc.

In example embodiments, the ESD protection circuits 100 may be coupled to a signal transmission line that coupled between the external input terminal 105 and the scan driving unit 620, and may be coupled to a signal transmission line that coupled between the external input terminal 105 and the data driving unit 630. Thus, when external pulse voltage due to external pulse voltage due to electro static discharges from being input into the internal circuit through the signal transmission line, the ESD protection circuits 100 may prevent (e.g., sufficiently prevent or reduce) electro static discharge from flowing into the scan driving unit 620 and the data driving unit 630.

In example embodiments, the ESD protection circuits 100 may be coupled to at least one of the scan lines 720 and data lines 740. According to one example embodiment, the ESD protection circuits 100 may be coupled between the scan driving unit 620 and the scan line, and may be coupled between the data driving unit 630 and the data line.

However, the signal transmission lines coupling to the ESD protection circuits are not limited thereto. The signal transmission line may include all transmission lines included in the display device 600, such as transmission lines coupled to the power unit, transmission line coupled to the timing control unit, etc. Because the ESD protection circuit 100 is described above, duplicate descriptions will not be repeated.

As described above, the display device 600 may not require add extra external ESD protection circuits. The ESD protection circuit 100 may reduce a size of the ESD protection circuit, may reduce manufacturing costs of the ESD protection circuit, and may simplify a manufacturing process of the ESD protection circuit. Here, the ESD protection circuit may efficiently protect a plurality of internal circuits of an electronic device from an external pulse voltage due to electro static discharges based on a simple circuit structure in which a plurality of oxide thin film transistors having stable characteristics are coupled in parallel.

Particularly, oxide semiconductors may be included the ESD protection circuit 100, so that the display device having oxide thin film transistors including the ESD protection circuit 100 is produced more effectively.

The ESD protection circuit 100 may be applied to all electronic devices having external input terminals. The ESD protection circuits 100 may prevent (e.g., sufficiently prevent or reduce) electro static discharge from flowing into the electronic devices. So that, reliability of the electronic devices is increased. For example, the ESD protection circuits 100 may be applied with at least one volatile memory device such as a dynamic random access memory (DRAM) device, a static random access memory (SRAM) device, a mobile dynamic random access memory (mobile DRAM) device, etc. and/or at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. Thus, the electronic devices applying the ESD protection circuit 600 may increase reliability.

The present embodiments may be applied with or to an electronic device requiring an ESD protection circuit. For example, the present embodiments may be applied to a television, a digital television, a mobile phone, a smart phone, a laptop computer, a tablet computer, a personal digital assistants (PDA), a portable multimedia player (PMP), a digital camera, a music player, a portable game console, a navigation device, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and aspects of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, and their equivalents.

What is claimed is:

1. An electro static discharge (ESD) protection circuit comprising a signal transmission line coupled to an external input terminal, the ESD protection circuit comprising:
   a first power line coupled to a high voltage power supply;
   a second power line coupled to a low voltage power supply;
   a plurality of first oxide thin film transistors coupled in parallel between the first power line and the signal transmission line, the first oxide thin film transistors being diode-connected; and
   a plurality of second oxide thin film transistors coupled in parallel between the signal transmission line and the second power line, the second oxide thin film transistors being diode-connected,
   wherein a W/L of a channel of each of the first and second oxide thin film transistors is less than 1,
   wherein the first oxide thin film transistors and the second oxide thin film transistors each comprise a gate electrode, a first electrode, and a second electrode,
   wherein each of the first oxide thin film transistors is diode-connected such that the second electrode of each of the first oxide thin film transistors is coupled to the first power line, the first electrode of each of the first oxide thin film transistors is coupled to the signal transmission line at a common node, and the gate electrode of each of the first oxide thin film transistors is coupled to the first electrode of a corresponding one of the first oxide thin film transistors, and
   wherein each of the second oxide thin film transistors is diode-connected such that the second electrode of each of the second oxide thin film transistors is coupled to the signal transmission line at the common node, the first electrode of each of the second oxide thin film transistors is coupled to the second power line, and the gate electrode of each of the second oxide thin film transistors is coupled to the first electrode of a corresponding one of the second oxide thin film transistors.

2. The circuit of claim 1, wherein the first oxide thin film transistors and the second oxide thin film transistors are N-channel oxide thin film transistors each having a positive threshold voltage.

3. The circuit of claim 2, wherein a first protection unit comprises the first oxide thin film transistors, and
   wherein the first protection unit is configured to turn on the first oxide thin film transistors such that a current flows from the signal transmission line to the first power line when a voltage that is higher than a value corresponding to the threshold voltage of each of the first oxide thin film transistors plus a voltage supplied by the high voltage power supply is applied to the signal transmission line.

4. The circuit of claim 2, wherein a second protection unit comprises the second oxide thin film transistors, and
   wherein the second protection unit is configured to turn on the second oxide thin film transistors such that a current flows from the second power line to the signal transmission line when a voltage that is lower than a value corresponding to a voltage supplied by the low voltage power supply minus the threshold voltage of each of the second oxide thin film transistors is applied to the signal transmission line.

5. The circuit of claim 1, wherein the first oxide thin film transistors and the second oxide thin film transistors are P-channel oxide thin film transistors each comprising a gate electrode, a first electrode, and a second electrode, the P-channel oxide thin film transistors each having a negative threshold voltage.

6. The circuit of claim 5, wherein a first protection unit comprises the first oxide thin film transistors, and
   wherein the first protection unit is configured to turn on the first oxide thin film transistors such that a current flows from the signal transmission line to the first power line when a voltage that is higher than a value corresponding to the threshold voltage of each of the first oxide thin film transistors plus a voltage supplied by the high voltage power supply is applied to the signal transmission line.

7. The circuit of claim 5, a second protection unit comprises the second oxide thin film transistors, and
   wherein the second protection unit is configured to turn on the second oxide thin film transistors such that a current flows from the second power line to the signal transmission line when a voltage that is lower than a value corresponding to a voltage supplied by the low voltage power supply minus the threshold voltage of each of the second oxide thin film transistors is applied to the signal transmission line.

8. An electronic device comprising an internal circuit, a signal transmission line configured to transmit a signal from an external input terminal to the internal circuit, and an electro static discharge (ESD) protection circuit, wherein the ESD protection circuit comprises:
- a first power line coupled to a high voltage power supply;
- a second power line coupled to a low voltage power supply;
- a plurality of a first oxide thin film transistors coupled in parallel between the first power line and the signal transmission line; and
- a plurality of a second oxide thin film transistors coupled in parallel between the signal transmission line and the second power line,
- wherein the first oxide thin film transistors and the second oxide thin film transistors each comprise a gate electrode, a first electrode, and a second electrode,
- wherein each of the first oxide thin film transistors is diode-connected such that the second electrode of each of the first oxide thin film transistors is coupled to the first power line, the first electrode of each of the first oxide thin film transistors is coupled to the signal transmission line at a common node, and the gate electrode of each of the first oxide thin film transistors is coupled to the first electrode of a corresponding one of the first oxide thin film transistors,
- wherein each of the second oxide thin film transistors are diode-connected such that the second electrode of each of the second oxide thin film transistors is coupled to the signal transmission line at the common node, the first electrode of each of the second oxide thin film transistors is coupled to the second power line, and the gate electrode of each of the second oxide thin film transistors is coupled to the first electrode of a corresponding one of the second oxide thin film transistors, and
- wherein a W/L of a channel of each of the first oxide thin film transistors and the second oxide thin film transistors is less than 1.

9. The device of claim 8, wherein the first oxide thin film transistors and the second oxide thin film transistors are N-channel oxide thin film transistors having a positive threshold voltage.

10. The device of claim 9, wherein the electronic device comprises a display device comprising a display panel, a scan driving unit, a data driving unit, a timing control unit, and a power unit.

11. The device of claim 10, wherein the signal transmission line comprises at least one of a scan line, a data line, a transmission line coupled between the external input terminal and the scan driving unit, and a transmission line coupled between the external input terminal and the data driving unit.

* * * * *